(12) United States Patent
Malone et al.

(10) Patent No.: US 7,280,358 B2
(45) Date of Patent: Oct. 9, 2007

(54) LIQUID LOOP WITH MULTIPLE HEAT EXCHANGERS FOR EFFICIENT SPACE UTILIZATION

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/827,801

(22) Filed: Apr. 19, 2004

(65) Prior Publication Data

US 2005/0231910 A1    Oct. 20, 2005

(51) Int. Cl.
*H05K 7/20* (2006.01)
*F28F 7/00* (2006.01)
*H05K 1/00* (2006.01)
*H01L 23/34* (2006.01)

(52) U.S. Cl. .............. 361/701; 361/695; 361/699; 361/702; 165/80.4; 165/80.5; 165/104.33; 174/15.1; 174/15.2; 174/252; 257/714

(58) Field of Classification Search ............ 361/695, 361/699, 701, 702; 165/80.4, 104.33, 80.5; 174/15.1, 15.2, 252; 257/714
See application file for complete search history.

(56) References Cited

U.S. PATENT DOCUMENTS

| | | | |
|---|---|---|---|
| 4,072,188 A | 2/1978 | Wilson et al. | |
| 5,020,586 A | 6/1991 | Mansingh | |
| 5,131,233 A | 7/1992 | Cray et al. | |
| 5,285,347 A * | 2/1994 | Fox et al. | 361/699 |
| 5,293,930 A | 3/1994 | Pitasi | |
| 5,339,214 A * | 8/1994 | Nelson | 361/695 |
| 5,647,216 A | 7/1997 | Garrett | |
| 6,038,128 A * | 3/2000 | Hood et al. | 361/687 |
| 6,088,223 A * | 7/2000 | Diemunsch | 361/690 |
| 6,313,990 B1 * | 11/2001 | Cheon | 361/699 |
| 6,351,381 B1 | 2/2002 | Bilski et al. | |
| 6,377,453 B1 | 4/2002 | Belady | |
| 6,418,018 B1 * | 7/2002 | Lo | 361/700 |
| 6,496,386 B2 | 12/2002 | Warzecha et al. | |
| 6,504,719 B2 * | 1/2003 | Konstad et al. | 361/698 |
| 6,510,052 B2 * | 1/2003 | Ishikawa et al. | 361/687 |
| 6,529,377 B1 | 3/2003 | Nelson et al. | |
| 6,536,516 B2 | 3/2003 | Davies et al. | |
| 6,628,520 B2 | 9/2003 | Patel et al. | |
| 6,637,505 B1 * | 10/2003 | Sasaki | 165/122 |
| 6,926,070 B2 * | 8/2005 | Jenkins et al. | 165/79 |
| 2002/0117291 A1 * | 8/2002 | Cheon | 165/80.4 |
| 2003/0051859 A1 * | 3/2003 | Chesser et al. | 165/46 |
| 2003/0188538 A1 | 10/2003 | Chu et al. | |
| 2004/0057205 A1 | 3/2004 | Chen et al. | |
| 2005/0180105 A1 * | 8/2005 | Matsushima et al. | 361/699 |

FOREIGN PATENT DOCUMENTS

JP   4307993 A   10/1992
JP   7321267 A   12/1995

* cited by examiner

*Primary Examiner*—Jayprakash Gandhi
*Assistant Examiner*—Zachary M Pape

(57) ABSTRACT

A liquid loop cooling system, a tubing encloses an interior lumen within which a cooling fluid can circulate. A plurality of heat exchangers is coupled to the tubing and is configured within in a constrained space in conformance to space availability.

23 Claims, 8 Drawing Sheets

LIQUID LOOP WITH MULTIPLE HEAT EXCHANGERS FOR EFFICIENT SPACE UTILIZATION

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

Compact electronic systems and devices, for example compact computer servers with a rack-mount 1U form factor, typically have very little space available for implementing a cooling solution. Conventional air-cooled heat sinks generally must be directly connected to the heat source. The footprint of the heat sink cannot be much larger than the heat source given the intrinsic heat spreading resistance of an aluminum or copper heat sink. Given the restriction on heat sink height dictated by the form factor and the practical limits on heat sink footprint, cooling capabilities are highly restricted.

SUMMARY

In accordance with an embodiment of a liquid loop cooling system, a tubing encloses an interior bore or lumen within which a cooling fluid can circulate. A plurality of heat exchangers is coupled to the tubing and is configured within in a constrained space in conformance to space availability.

BRIEF DESCRIPTION OF THE DRAWINGS

Embodiments of the invention relating to both structure and method of operation, may best be understood by referring to the following description and accompanying drawings.

DETAILED DESCRIPTION

A liquid loop cooling system uses multiple heat exchangers in the loop to exploit available open space in the chassis of an electronic device.

Figure 1:
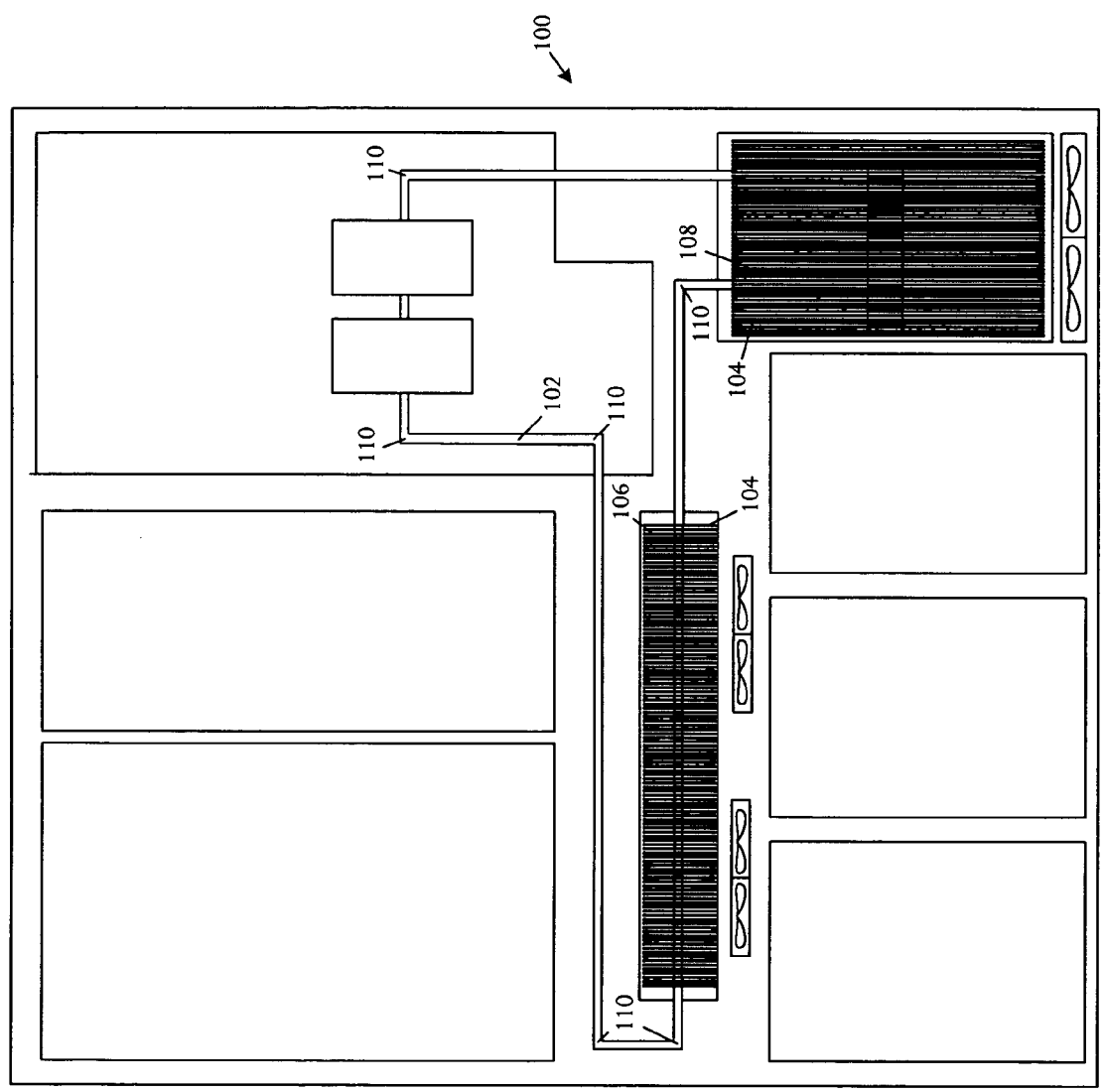
FIG. 1 is a perspective pictorial diagram showing a cooling apparatus for usage in an electronic system.

Referring to FIG. 1, an overhead pictorial view shows a liquid loop cooling system 100 that comprises a tubing 102 enclosing an interior bore or lumen within which a cooling fluid can circulate. Multiple heat exchangers 104 are coupled to the tubing 104 and are configured within in a constrained space in conformance to space availability. In some embodiments, various heat exchangers 106, 108 have different shapes selected to conform to localized spatial voids formed between system devices and components within an enclosure. Similarly, in some embodiments various heat exchangers 106, 108 have different sizes selected to conform to available localized spatial voids. Furthermore, to selectively arrange the heat exchangers 104 having various shapes and sizes to conform to available interior space, the tubing 102 can have multiple bends and/or angles 110 to appropriately position the heat exchangers 104.

Referring to FIGS. 2A, 2B, 2C, 2D, and 2E, several schematic pictorial diagrams illustrate examples of heat exchangers having various sizes and shapes.

Figure 2A:
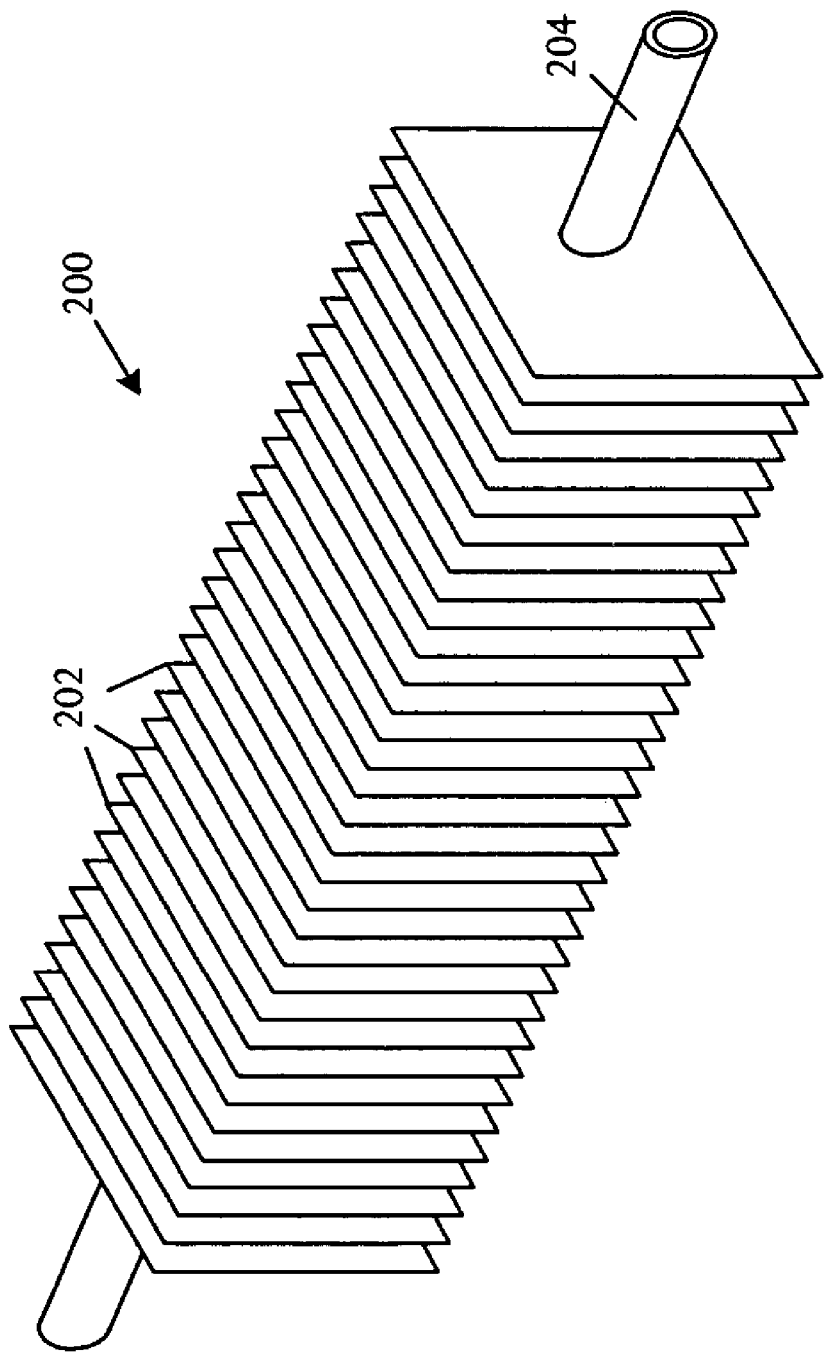
FIGS. 2A, 2B, 2C, 2D, 2E and 2F are schematic pictorial diagrams that illustrate examples of heat exchangers having various sizes and shapes.

FIG. 2A depicts a single-pass liquid-to-air heat exchanger 200 constructed as a stack of closely-spaced plates or fins 202 attached to a tubing or tube segment 204 having a longitudinal axis and a circular cross-section. In some embodiments, the closely-stacked plates 202 may be arranged substantially perpendicular to the longitudinal axis of the tube segment 204. The single-pass heat exchanger 200 can be relatively long and thin for positioning within long and narrow spaces between components and devices within a chassis or housing. For example, the single-pass liquid-to-air heat exchanger 200 may be inserted in a space adjacent to one or more input/output devices.

Figure 2B:
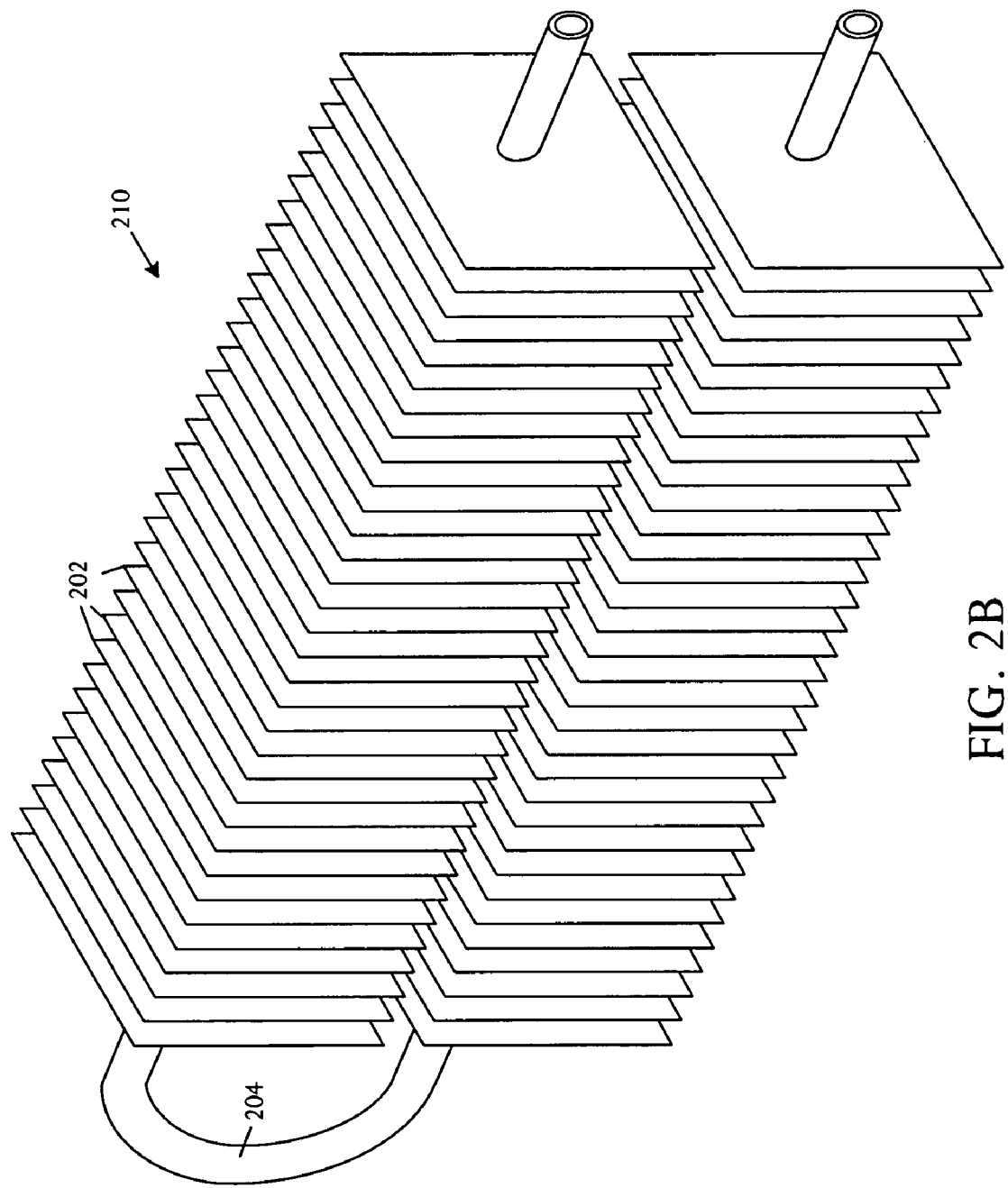

FIG. 2B illustrates an embodiment of a dual-pass liquid-to-air heat exchanger 210 in which more heat can be transferred to the air than in a single-pass exchanger. The dual-pass exchanger 210 may be arranged to fit available space within a chassis. For example, for long, narrow trenches between components and devices, the dual-pass exchanger 210 may be inserted into a trench with parallel segments of the tubing 204 stacked vertically. In other examples, wider spaces between components and devices may enable the parallel segments of the dual-pass heat exchanger 210 to be stacked horizontally, increasing heat removal for low-lying components such as processors.

Figure 2C:
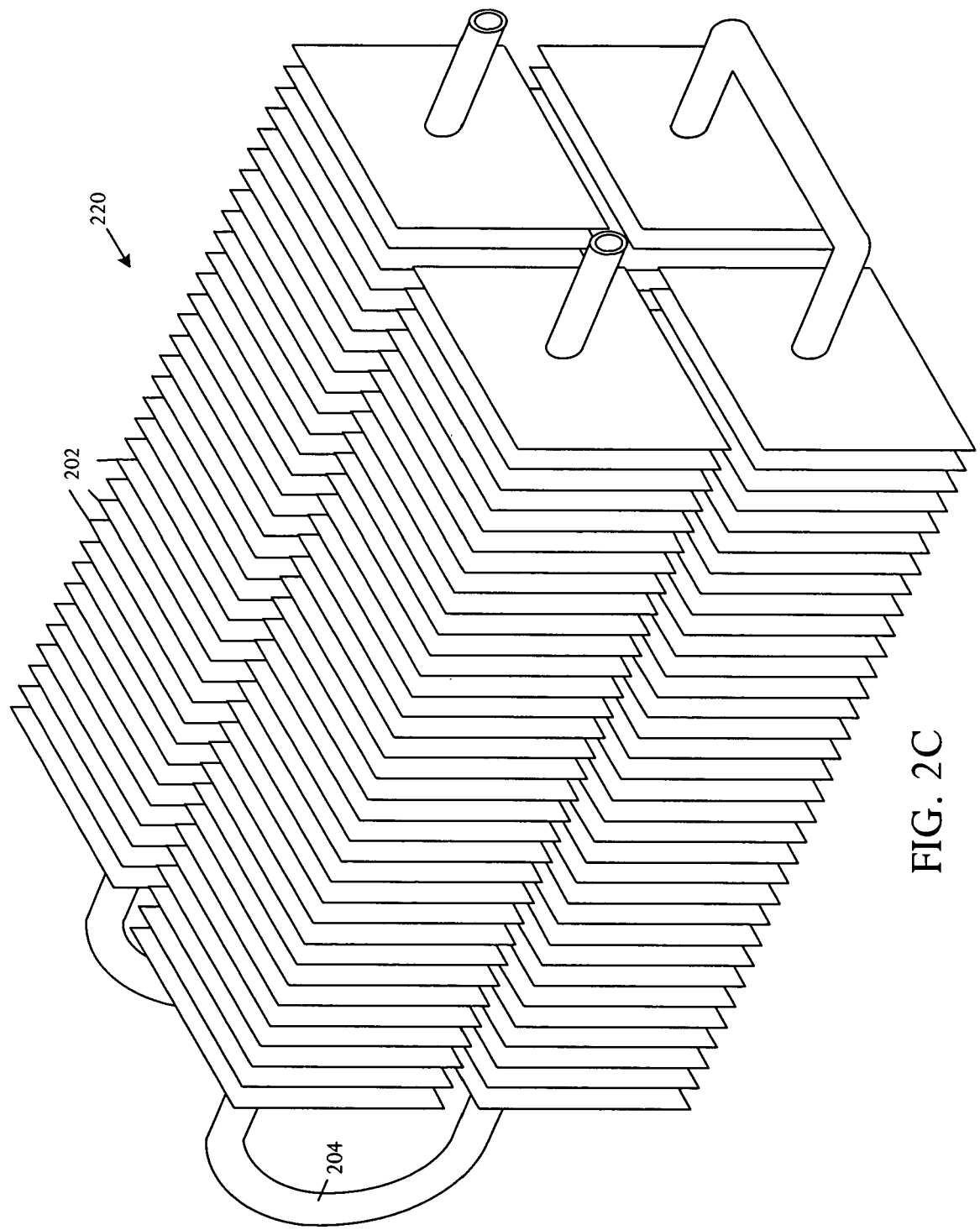

FIG. 2C shows an embodiment of a multiple-pass liquid-to-air heat exchanger 220, more specifically a quad-pass exchanger although any number of tubing segments 204 may be used, depending on available spacing and form factor considerations. The tube 204 may pass through a fin bank 202 multiple times and in various orientations to attain improved or optimized cooling performance. The multiple-pass heat exchanger 220 may be used in systems with relative large spaces between components and devices to even further supply a cooling capability. In the illustrative embodiment, fins 202 coupled to the various tubing segments 204 are separated by a gap to reduce or eliminate reheating of the cooling liquid by conduction of heat along the fins 202.

Figure 2D:
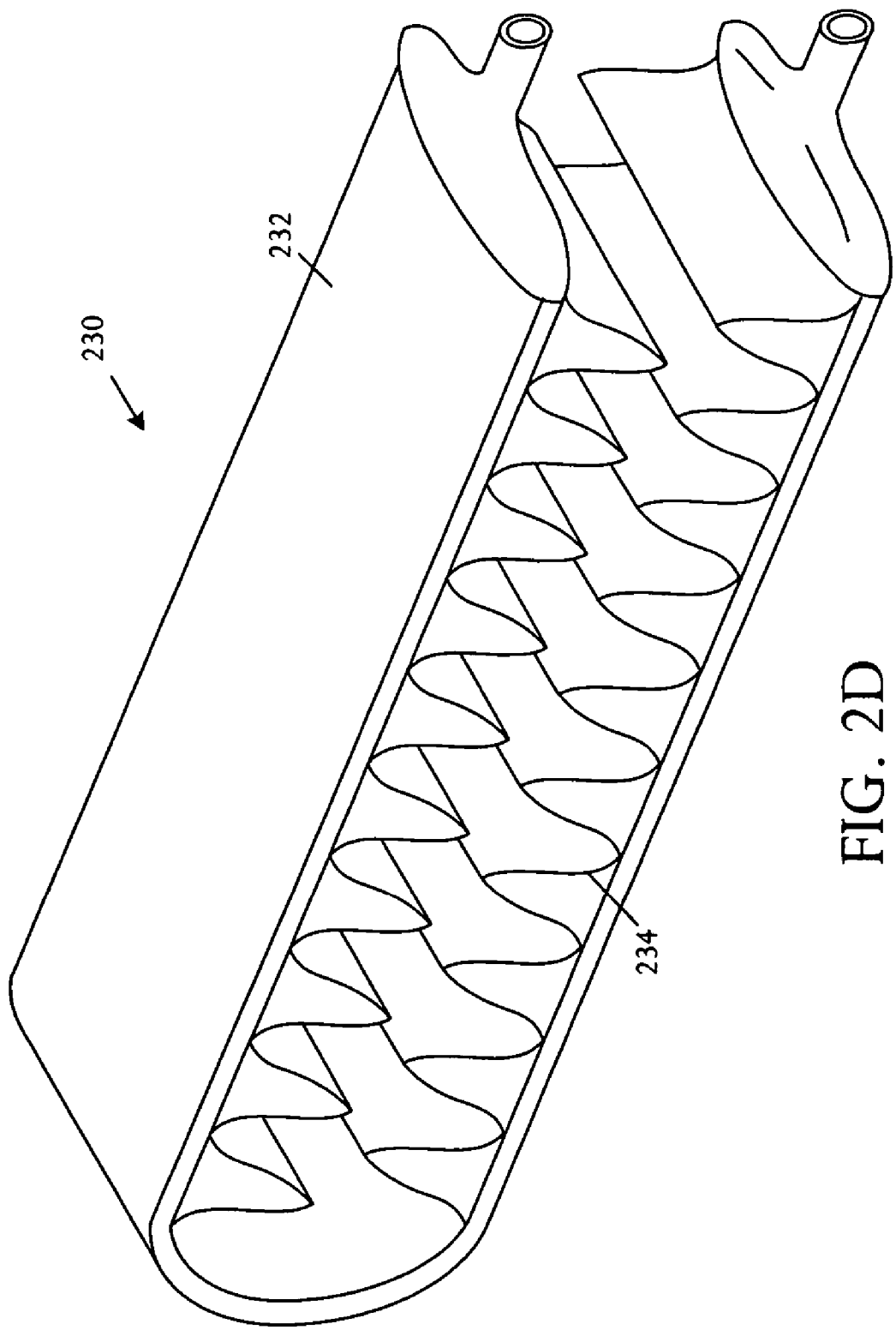

FIG. 2D illustrates an embodiment of a dual-pass liquid-to-air heat exchanger 230 is in the form of a flattened tube 232 for carrying a cooling liquid with folded fins 234 soldered or braised to the tube 232. In the illustrative embodiment, two separate sets of folded fins are used, one attached to a first tube segment and a second attached to a second tube segment. The flattened-tube heat exchanger 230 enables a large variety of arrangements, sizes, and configurations, simply by selecting the sizes and topology of folded fins 234 and tube 232.

Figure 2E:
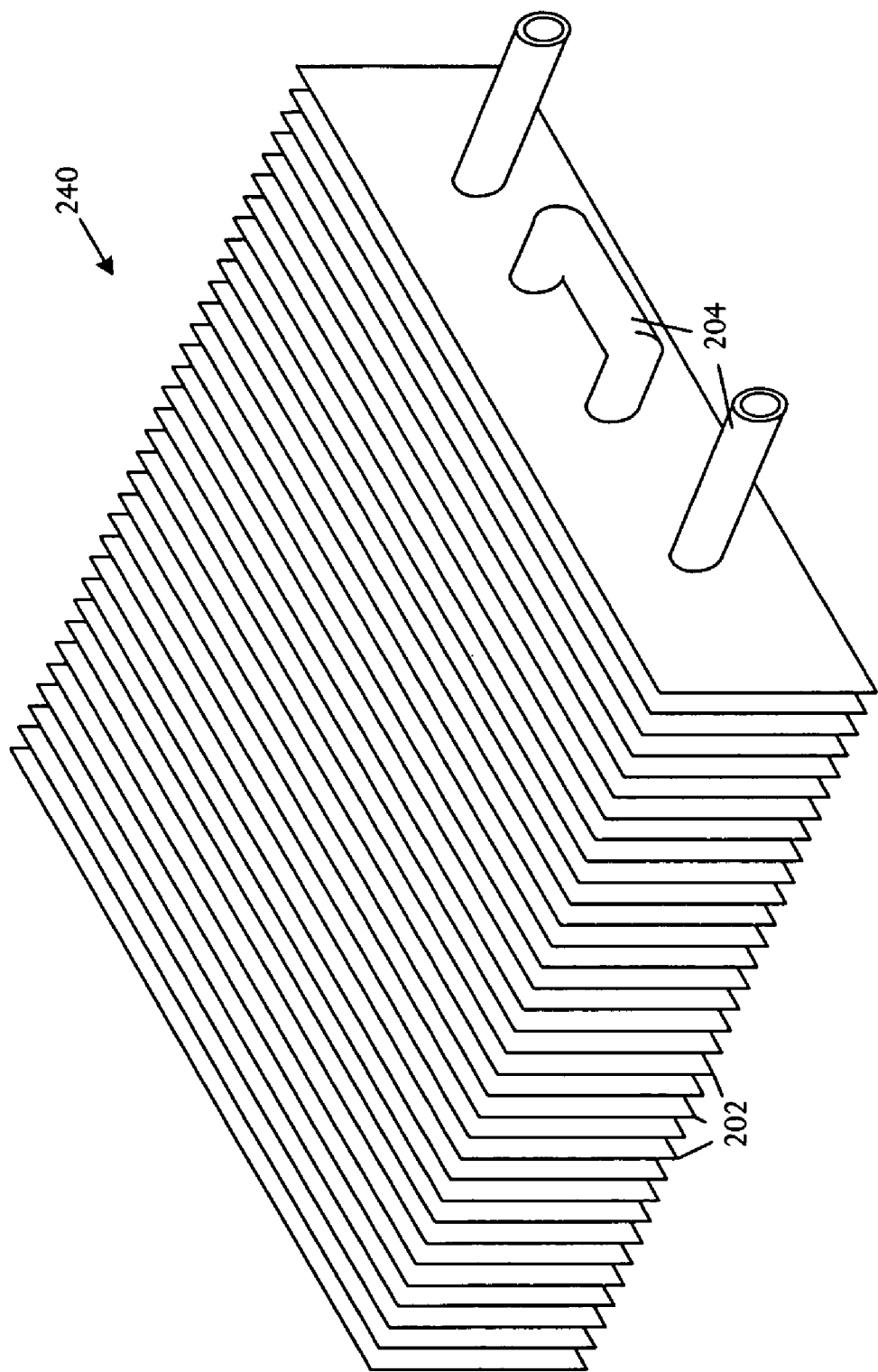

FIG. 2E illustrates and example of a relatively short and flat multiple-pass heat exchanger 240 with a plurality of tubing segments 204 passing through a single stack of fins 202. The heat exchanger 240 may be used in a relatively wide and long, but low height space in a system. In other examples, the heat exchanger 240 may be positioned overlying a group of low-lying components, such as multiple components such as processors and memory, on a printed circuit card.

Figure 2F:
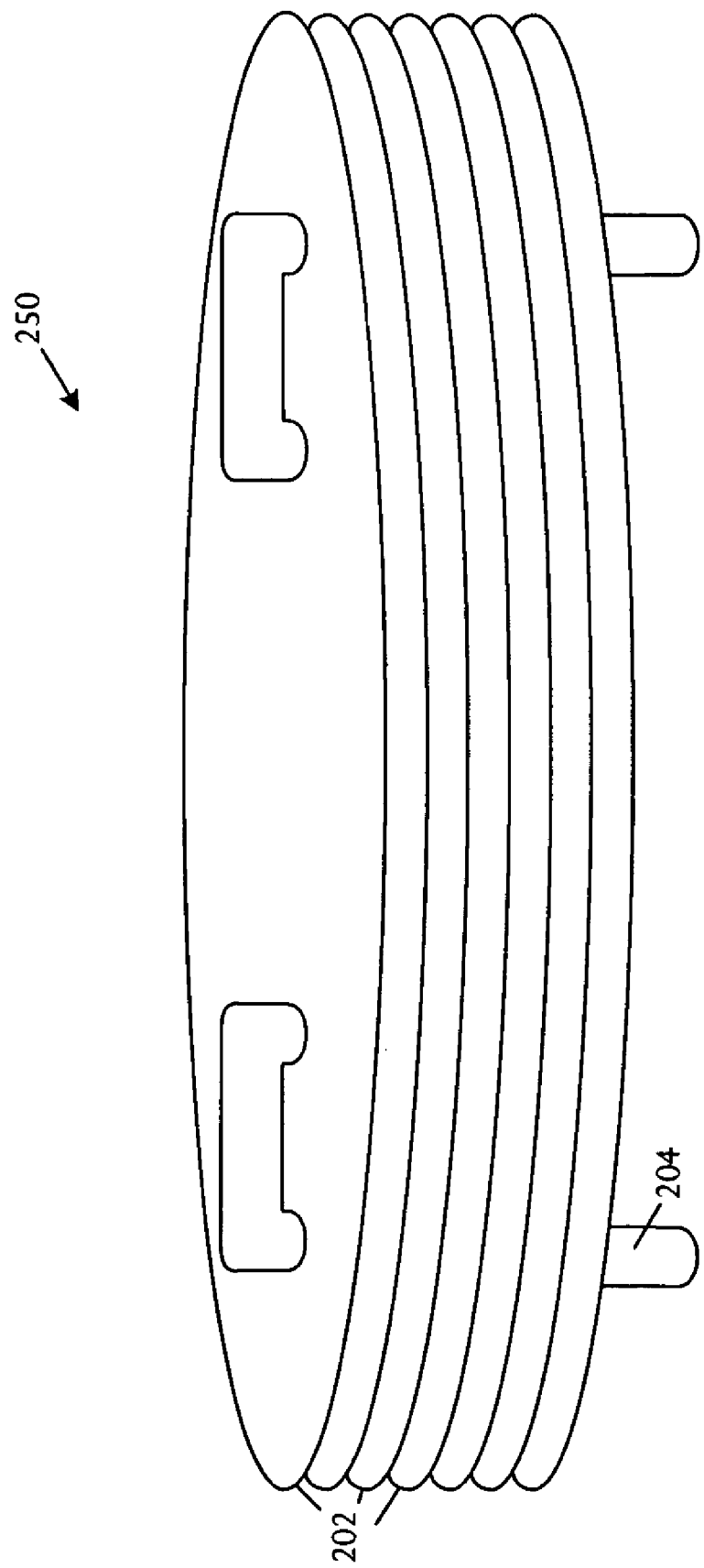

FIG. 2F illustrates an example of a single or multiple-pass heat exchanger 250 with fins or plates 202 in the form of a plurality of elliptical or circular disks with one or more tube segments 204 passing through the fins or places 202. In some examples, the elliptical or circular heat exchanger 250 may also be used in low height spaces.

Figure 3:
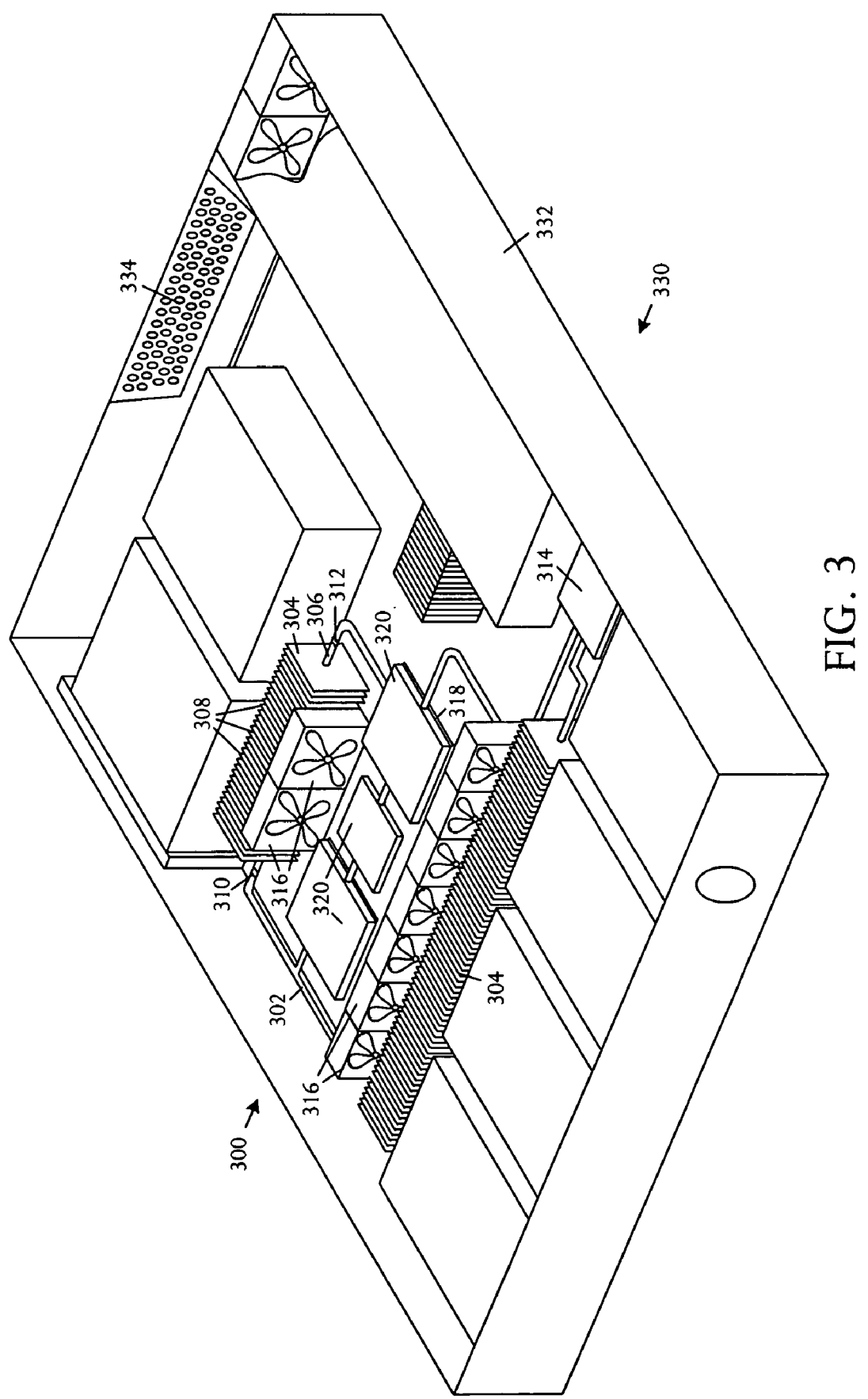
FIG. 3 is a perspective pictorial diagram illustrating an embodiment of a liquid loop cooling system

Referring to FIG. 3, a perspective pictorial diagram illustrates an embodiment of a liquid loop cooling system 300 including a tubing 302 enclosing an interior lumen within which a cooling fluid can circulate, and a plurality of heat exchangers 304 coupled to the tubing 302. The individual heat exchangers 304 include a tube segment 306 enclosing a segment interior lumen that passes the cooling fluid and extends from a first end to a second end, and a plurality of fins 308 coupled to the tube segment 306. The heat exchangers 304 also include first 310 and second 312 connectors coupled respectively to the first and second ends and capable of coupling the heat exchanger 304 to the tubing 302.

In some embodiments, the cooling system 300 has multiple heat exchangers 304 with different shapes and/or sizes configured to conform to the sizes and shapes of localized spatial voids inside a system enclosure. The tubing 302 is typically configured with a plurality of angles and/or bends formed into the tubing 302 so that the plurality of heat exchangers 304 is positioned in conformance with space availability. For example, heat exchangers 304 can be distributed in the chassis interior according to positioning of interior voids between devices and components. The interior heat exchanges 304 can be arranged with nearby associated fans 316 that pressurize the down-stream portion of the chassis to drive warmed air out of the chassis through venting.

A pump 314 can be coupled to the tubing 302 and capable of pumping the cooling fluid through the tubing 302. In some cooling systems 300 the pump 314 can be omitted, for example systems in which the fluid is gravity-driven. The cooling system 300 also includes the cooling fluid, in some examples and ethylene glycol-based fluid although other suitable fluids may otherwise be used. The cooling fluid is contained within the tubing 302 and the tube segments 306 of the plurality of heat exchangers 304.

One or more fans 316 configured to drive air through the heat exchangers 304 can be included in the cooling system 300. In addition, one or more cold plates 318 may be coupled to the tubing 302. The cold plates 318 are generally attached to processors and other high-power components 320 to enable cooling of localized heat sources.

Referring to FIG. 3 in combination with one or more of the FIGS. 2A through 2F, a computer server 330 is shown that includes a chassis 332 including airflow inlet and outlet vents 334, and fans 316 capable of circulating air from the inlet vents to the outlet vents. The computer server 330 further includes a plurality of components 320 mounted within the chassis, a tubing 302 enclosing an interior lumen within which a cooling fluid can circulate, and the plurality of heat exchangers 304 coupled to the tubing 302. The individual heat exchangers 304 include a tube segment 204 enclosing a segment interior lumen that passes the cooling fluid and extends from a first end to a second end, a plurality of fins 202 coupled to the tube segment, and first 310 and second 312 connectors coupled respectively to the first and second ends and capable of coupling the heat exchanger 304 to the tubing 302.

The various heat exchangers 304 may have different shapes and/or sizes in an arrangement that improves or optimizes volume usage inside the chassis 332. Heat exchangers 304 may be added to the liquid loop to exploit otherwise unused volume within the electronics chassis 332, enabling usage of different sized fans 316 for heat exchangers 304 with different shapes.

Electronic system architectures such as server architectures with a compact form factor may include the liquid loop cooling apparatus 300 to accommodate increasing power and power density levels of components including microprocessors and associated electronics. In some embodiments, the liquid loop cooling system 300 may use the pump 314 to drive the cooling fluid through high pressure-drop channels of the cold plates 318 attached to processors and other high-power components. The pump 314, if included in the cooling system embodiment, also drives the cooling fluid along a potentially long and narrow-diameter tube that completes the loop between the cold plates 318, the heat exchanger 304, and the pump 314. Forced-air convection at the heat exchanger 304 removes heat from the loop.

In a compact electronic system 330, for example a compact server or computer system, cooling air is driven across the heat exchanger 304 using tube-axial or blower fans 316 in close proximity to the heat exchanger fins. Redundant fans 316 are typically used for electronic systems 330.

The liquid loop cooling system 300 and computer server 330 can be configured by determining space availability within a chassis 332 that contains components 320 of the computer server 330 and arranging the sizes and shapes of the multiple heat exchangers 304 to fit into the localized spatial voids within the chassis 332. The multiple heat exchangers 304 are connected using the tubing 302 that is formed and configured to position the heat exchangers 304 in the available space arrangement.

In some embodiments, the heat distribution within the chassis 332 containing components 320 of the electronic system 330 can be determined and the sizes and shapes of the multiple heat exchangers 304 can be selected based on heat distribution and the available space in combination. The multiple heat exchangers 304 can be then connected with the tubing 302 in a configuration that positions the heat exchangers 304 according to the heat distribution and available space arrangement.

The sizes and shapes of the fans 316 can also be selected based on the configuration of heat exchangers 304 and/or based on the heat distribution within the chassis 332. The selected fans 316 are positioned to appropriately drive air through the plurality of heat exchangers 304.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, although particular geometries of the heat exchanger are shown, other arrangements are possible including multiple-pass arrangements in which additional tube segments are added. Also, particular electronic system embodiments are illustrated, for example a computer server. In other embodiments, the external heat exchanger can be employed in other types of electronic systems such as communication systems, storage systems, entertainment systems, and the like.

What is claimed is:

1. A liquid loop cooling system for usage in a highly compact electronic system chassis comprising:
   a tubing enclosing an interior bore or lumen within which a cooling fluid can circulate in a liquid loop; and
   a plurality of distinct liquid-to-air heat exchangers coupled in series to the tubing at a plurality of positions along the liquid loop and distributed in spaces between electronic components in multiple different separated locations within the system chassis in conformance to space availability.

2. The cooling system according to claim 1 further comprising:
   a plurality of liquid-to-air heat exchangers with different fin configurations, shapes and/or sizes selected to conform to localized spatial voids between the electronic components within the system chassis.

3. The cooling system according to claim 1 further comprising:
   a plurality of bends and/or angles formed into the tubing and positioning the plurality of liquid-to-air heat exchangers in conformance with localized spatial voids between the electronic components within the system chassis.

4. A liquid loop cooling system comprising:
   a tubing enclosing an interior lumen within which a cooling fluid can circulate in a liquid loop; and
   a plurality of distinct liquid-to-air heat exchangers coupled in series to the tubing at a plurality of positions along the liquid loop and distributed in spaces between electronic components in multiple different separated locations within a system chassis in conformance to space availability, the plurality of liquid-to-air heat exchangers comprising:
      a tube segment enclosing a segment interior lumen that passes the cooling fluid and extending from a first end to a second end;
      a plurality of fins coupled to the tube segment; and
      first and second connectors coupled respectively to the first and second ends and capable of coupling the heat exchanger to the tubing.

5. The cooling system according to claim 4 further comprising:
   the plurality of liquid-to-air heat exchangers with different fan configurations, shapes and/or sizes configured to conform to localized spatial voids between the electronic components within the system chassis.

6. The cooling system according to claim 4 further comprising:
   a plurality of angles formed into the tubing and positioning the plurality of liquid-to-air heat exchangers in conformance with localized spatial voids between the electronic components within the system chassis.

7. The cooling system according to claim 4 further comprising:
   a pump coupled to the tubing and capable of pumping the cooling fluid through the tubing.

8. The cooling system according to claim 4 further comprising:
   the cooling fluid contained within the tubing and the tube segments of the plurality of liquid-to-air heat exchangers.

9. The cooling system according to claim 4 further comprising:
   at least one fan configured to drive air through the liquid-to-air heat exchangers.

10. The cooling system according to claim 4 further comprising:
    at least one cold plate coupled to the tubing.

11. The cooling system according to claim 4 wherein at least one of the plurality of liquid-to-air heat exchangers further comprise:
    a tube segment having a longitudinal axis and a circular cross-section; and
    a stack of closely-spaced plates distributed along the longitudinal axis forming the fins coupled to the tube segment.

12. An electronic system comprising:
    a chassis including airflow inlet and outlet vents, and fans capable of circulating air from the inlet vents to the outlet vents;
    a plurality of components mounted within the chassis including at least one processor and at least one storage device;
    a tubing enclosing an interior lumen within which a cooling fluid can circulate in a liquid loop; and
    a plurality of distinct liquid-to-air heat exchangers coupled in series to the tubing at a plurality of positions along the liquid loop and distributed in spaces between components of the component plurality in multiple different separated locations within the chassis in conformance to space availability, the plurality of liquid-to-air heat exchangers comprising:
       a tube segment enclosing a segment interior lumen that passes the cooling fluid and extending from a first end to a second end;
       a plurality of fins coupled to the tube segment; and
       first and second connectors coupled respectively to the first and second ends and capable of coupling the liquid-to-air heat exchanger to the tubing.

13. The system according to claim 12 further comprising:
    a plurality of liquid-to-air heat exchangers with different shapes and/or configured to conform to space available between components of the component plurality in the chassis.

14. The system according to claim 12 further comprising:
    a plurality of angles and/or bends formed into the tubing and positioning the plurality of liquid-to-air heat exchangers in conformance with space available between components of the component plurality in the chassis.

15. The system according to claim 12 further comprising:
    a pump coupled to the tubing and capable of pumping the cooling fluid through the tubing.

16. The system according to claim 12 further comprising:
    at least one cold plate coupled to the plurality of liquid-to-air heat exchangers.

17. The system according to claim 12 further comprising:
    at least one fan configured to drive air through the liquid-to-air heat exchangers in cooperation with the plurality of liquid-to-air heat exchangers.

18. The system according to claim 12 wherein at least one of the plurality of liquid-to-air heat exchangers further comprise:
    a tube segment having a longitudinal axis and a circular cross-section; and
    a stack of closely-spaced plates arranged substantially perpendicular to the longitudinal axis forming the fins coupled to the tube segment.

19. The system according to claim 12 wherein:
    the chassis is a compact form factor chassis.

20. A method of configuring a liquid loop cooling system in an electronic system comprising:
- determining space availability between components within a chassis containing the components of a computer server;
- arranging sizes and shapes of a plurality of distinct liquid-to-air heat exchangers to fit into the available space between the components in multiple different separated locations within the chassis; and
- connecting the plurality of liquid-to-air heat exchangers in series with a tubing at a plurality of positions along a loop configured to position the liquid-to-air heat exchangers in the available space arrangement.

21. The method according to claim 20 further comprising:
- determining heat distribution within the chassis; and
- arranging sizes and shapes of the plurality of liquid-to-air heat exchangers based on heat distribution and the available space in combination; and
- connecting the plurality of liquid-to-air heat exchangers with the tubing according to the heat distribution and available space arrangement.

22. The method according to claim 20 further comprising:
- arranging fin configurations, sizes and shapes of at least one fan based on the liquid-to-air heat exchanger arrangement.

23. The method according to claim 22 further comprising:
- positioning the at least one fan to drive air through the plurality of liquid-to-air heat exchangers.

* * * * *

UNITED STATES PATENT AND TRADEMARK OFFICE
CERTIFICATE OF CORRECTION

PATENT NO.        : 7,280,358 B2
APPLICATION NO. : 10/827801
DATED             : October 9, 2007
INVENTOR(S)       : Christopher G. Malone et al.

It is certified that error appears in the above-identified patent and that said Letters Patent is hereby corrected as shown below:

In column 2, line 3, after "2D," delete "and 2E," and insert -- 2E, and 2F, --, therefor.

Signed and Sealed this

Twenty-fourth Day of June, 2008

JON W. DUDAS
*Director of the United States Patent and Trademark Office*